(12) United States Patent
Li

(10) Patent No.: US 7,459,941 B2
(45) Date of Patent: Dec. 2, 2008

(54) VOLTAGE DETECTING DEVICE

(75) Inventor: Zhen-Hua Li, Shenzhen (CN)

(73) Assignees: Hong Fu Jin Precision Industry (ShenZhen) Co., Ltd., Shenzhen, Guangdong Province (CN); Hon Hai Precision Industry Co., Ltd., Tu-Cheng, Taipei Hsien (TW)

( * ) Notice: Subject to any disclaimer, the term of this patent is extended or adjusted under 35 U.S.C. 154(b) by 0 days.

(21) Appl. No.: 11/309,634

(22) Filed: Sep. 1, 2006

(65) Prior Publication Data

US 2007/0152718 A1   Jul. 5, 2007

(30) Foreign Application Priority Data

Dec. 30, 2005   (CN) .......................... 2005 1 0121393

(51) Int. Cl.
*H03K 5/22* (2006.01)
*H03K 5/153* (2006.01)
(52) U.S. Cl. ....................................................... 327/77
(58) Field of Classification Search .............. 340/815.4; 327/72, 77, 78
See application file for complete search history.

(56) References Cited

U.S. PATENT DOCUMENTS

| 5,982,836 | A  | * | 11/1999 | Sakae et al. ................. 375/376 |
| 2004/0135619 | A1 | * | 7/2004 | Owen .......................... 327/427 |
| 2007/0030035 | A1 | * | 2/2007 | Komatsu et al. ............... 327/65 |
| 2007/0085574 | A1 | * | 4/2007 | Lo et al. ....................... 327/101 |

FOREIGN PATENT DOCUMENTS

CN   2255063 Y   5/1997

* cited by examiner

*Primary Examiner*—Quan Tra
*Assistant Examiner*—Daniel Rojas
(74) *Attorney, Agent, or Firm*—Wei Te Chung

(57) ABSTRACT

A device for detecting an interface voltage of a Universal Serial Bus (USB) interface. The device includes first and second voltage level indicators, and first and second control circuits. The first control circuit receives the interface voltage to generate a first control signal and drive the first voltage level indicator when the interface voltage level is less than a first voltage level. The second control circuit receives the interface voltage to generate a second control signal and drive the second voltage level indicator when the interface voltage level exceeds a second voltage level.

26 Claims, 2 Drawing Sheets

VOLTAGE DETECTING DEVICE

FIELD OF THE INVENTION

The present invention relates to voltage detection, and particularly to a voltage detecting device for Universal Serial Bus (USB) interfaces.

DESCRIPTION OF RELATED ART

The capability of computers is increased by utilizing a variety of external peripheral devices connected thereto. Among various peripheral interfaces, USB interfaces have become increasingly popular due to the advantages of enabling connection of all kinds of peripheral devices to the computer system in a simple manner with a high transmission speed. However, if a voltage of a USB interface becomes too high, a USB device connected thereto may be damaged or if the voltage of the USB interface is too low, the USB device may be unable to operate properly.

SUMMARY OF THE INVENTION

A device for detecting an interface voltage of a Universal Serial Bus (USB) interface is provided. In a preferred embodiment, the device comprises a first control circuit and a second control circuit. The first control circuit receives the interface voltage to generate a first control signal and drive a first voltage level indicator when the interface voltage level is less than a first voltage level. The second control circuit receives the interface voltage to generate a second control signal and drive the second voltage level indicator when the interface voltage level exceeds a second voltage level.

Other advantages and novel features will become more apparent from the following detailed description when taken in conjunction with the accompanying drawings, in which:

DETAILED DESCRIPTION OF THE INVENTION

Figure 1:
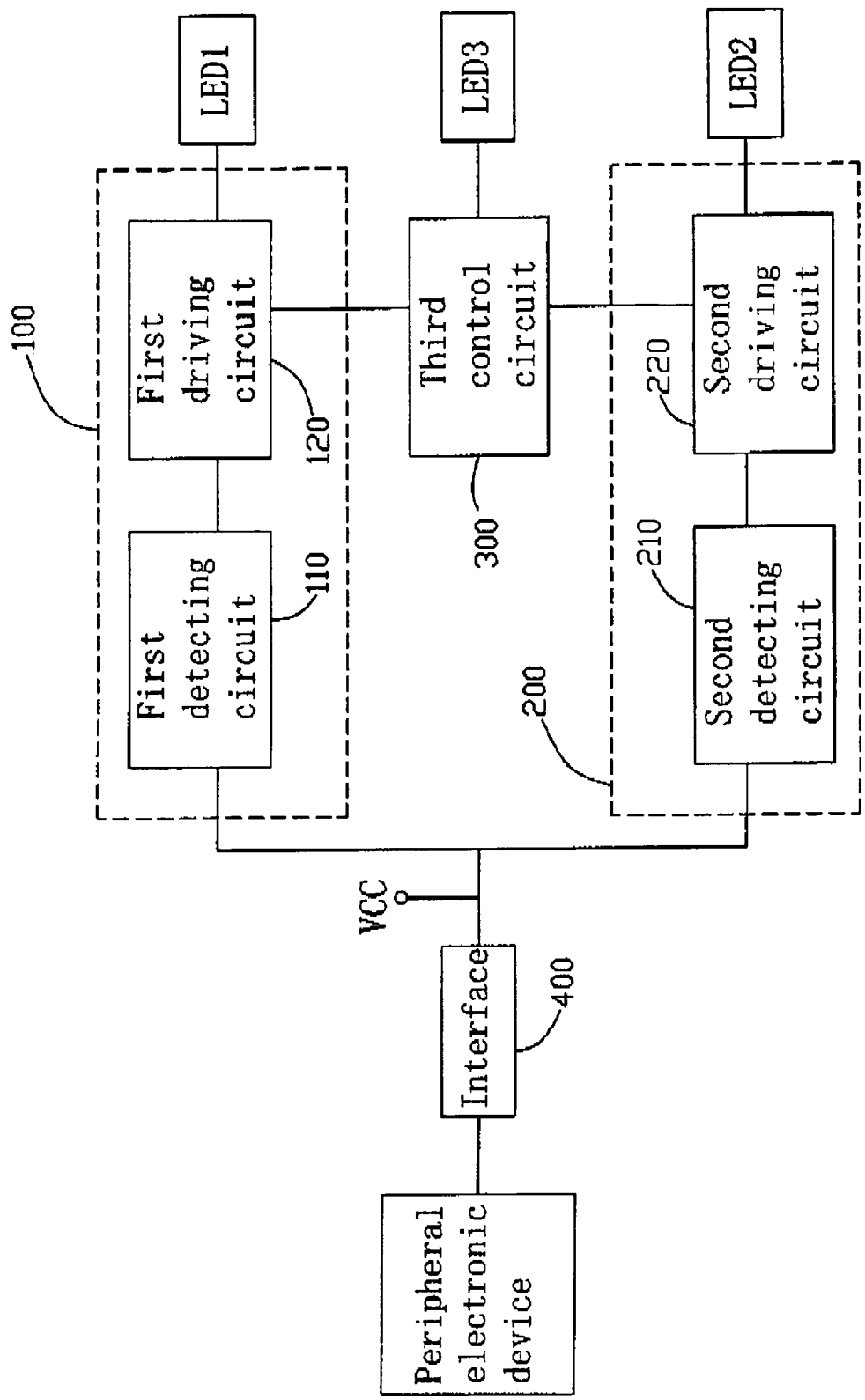
FIG. 1 is a block diagram of a device for detecting a USB interface voltage in accordance with a preferred embodiment of the invention.

FIG. 1 shows a device for detecting an interface voltage Vcc of an interface 400 according to a preferred embodiment of the invention, wherein the interface 400 receives a signal from a peripheral electronic device of which an operating voltage range is between 4.75V and 5.25V. The voltage detecting device comprises a first control circuit 100, a second control circuit 200, and a third control circuit 300 controlled by the first and second control circuits 100 and 200. When the interface voltage Vcc is less than 4.75V, the first control circuit 100 turns on a low voltage indicator. When the interface voltage Vcc is equal to or exceeds 5.25V, the second control circuit 200 turns on a high voltage level indicator. Further, when the interface voltage Vcc is within 4.75V and 5.25V, the third control circuit 300 turns on a normal voltage level indicator.

As shown, light-emitting diodes (LEDs) LED1, LED2 and LED3 are utilized as the exemplary low voltage level, high voltage level, and normal voltage level indicators respectively. Other components capable of displaying detection results, such as a buzzer, can be utilized as the voltage level indicators of the device for detecting the interface voltage Vcc with the principles of the invention.

Figure 2:
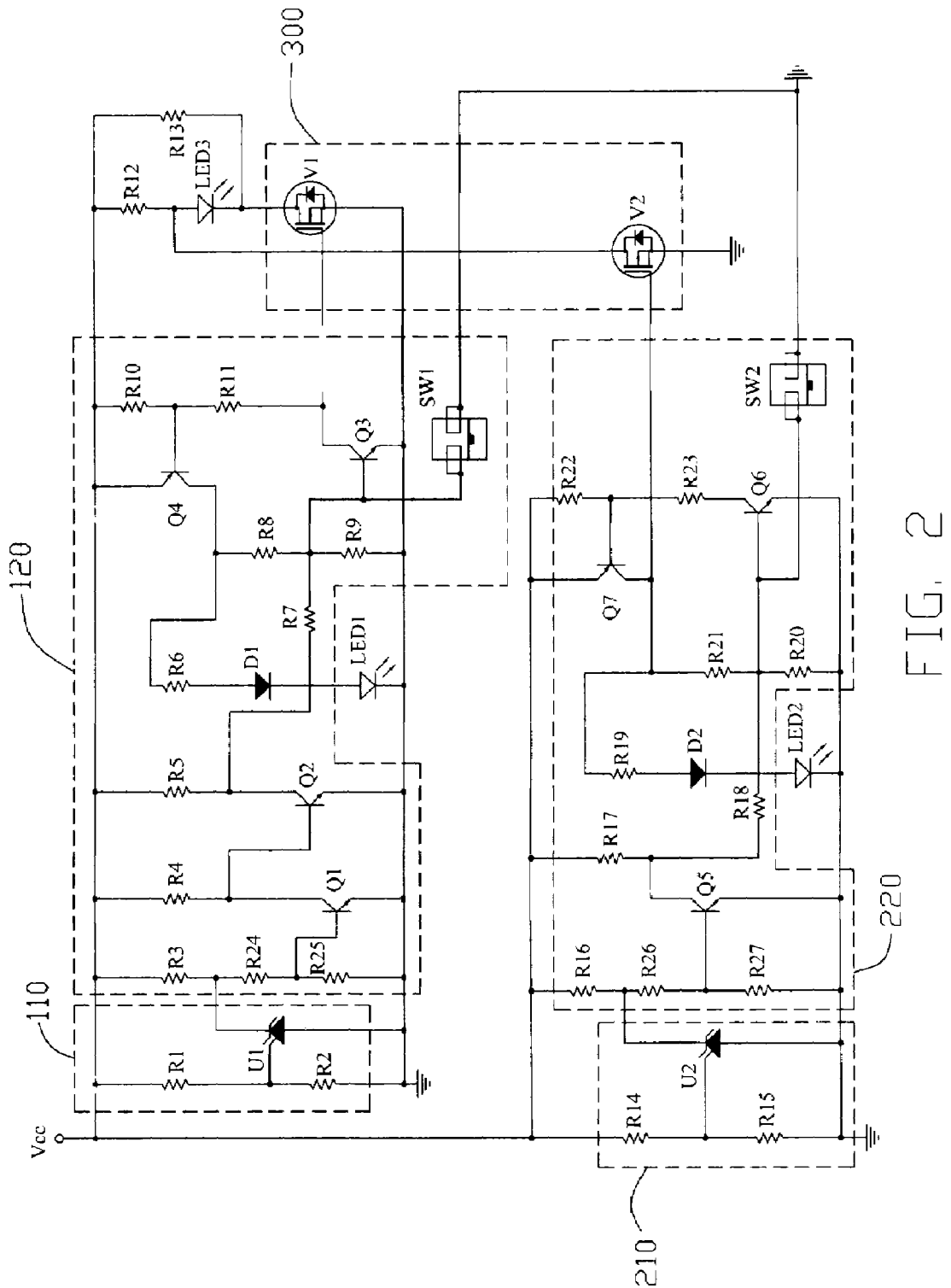
FIG. 2 is a circuit diagram of the device for detecting the USB interface voltage of FIG. 1.

Referring to FIG. 2, the first control circuit 100 comprises a first detecting circuit 110 and a first driving circuit 120. The first detecting circuit 110 comprises two resistors R1 and R2, and a first detecting element U1, wherein the first detecting element U1 generates a first detect signal received by the first driving circuit 120 in response to a voltage at the junction of the resistors R1 and R2. As shown, an adjustable precision Zener shunt regulator is utilized as an exemplary detecting element U1. Resistors R1 and R2 connected in series form a voltage divider, wherein ends of the voltage divider are connected to an interface voltage terminal Vcc and ground respectively. The shunt regulator U1 includes a reference terminal, a cathode, and an anode, wherein the reference terminal thereof is connected to the junction of the first and second resistors R1 and R2, and the anode thereof is connected to ground. The first driving circuit 120 comprises resistors R3~R11, R24, and R25, NPN transistors Q1~Q3, a PNP transistor Q4, and a diode D1. Ends of the resistor R3 are connected to the voltage terminal Vcc and a node of the cathode of the shunt regulator U1 and the resistor R24 respectively. The other terminal of the resistor R24 is connected to a base of the transistor Q1 which is connected to ground via the resistor R25. A collector of the transistor Q1 is connected to Vcc via the resistor R4, and an emitter thereof is connected to ground. The transistor Q2 has a base connected to the collector of the transistor Q1, a collector connected to Vcc via the resistor R5, and an emitter connected to ground. The transistor Q3 has a base connected to the collector of transistor Q2 via the resistor R7, and to ground via the resistor R9. The base of transistor Q3 is further connected to ground via the resistors R8 and R6, an anode of the diode D1, and an anode of the diode LED1 in turn. Further, the base of transistor Q3 is connected to ground via a switch SW1. A collector of transistor Q3 is connected to a base of the transistor Q4 via the resistor R11 and an emitter thereof is connected to ground. The transistor Q4 has the base connected to the Vcc via the resistor R10, a collector connected to the junction of the resistors R6 and R8, and an emitter connected to Vcc.

The second control circuit 200 comprises a second detecting circuit 210 and a second driving circuit 220. The second detecting circuit 210 comprises two resistors R14 and R15 and a second detecting element U2, wherein the detecting element U2 generates a second detect signal transmitted to the second driving circuit 220 in response to a voltage at the junction of the resistors R14 and R15. Similarly, an adjustable precision Zener shunt regulator is utilized as the detecting element U2. Resistors R14 and R15 connected in series, form a voltage divider, wherein ends of the voltage divider are connected to Vcc and ground respectively. The shunt regulator U2 includes a reference terminal, a cathode and an anode, wherein the reference terminal is connected to the junction of the resistors R14 and R15, and the anode is connected to ground. The second driving circuit 220 comprises resistors R16~R23, R26 and R27, NPN transistors Q5 and Q6, a PNP transistor Q7 and a diode D2. The resistor R16 is connected to Vcc at one terminal thereof and is connected to the cathode 2 of the shunt regulator U2 and the resistor R26. The other terminal of the resistor R26 is connected to a base of the transistor Q5, which is connected to ground via the resistor R27. A collector of the transistor Q5 is connected to Vcc via the resistor R17, and an emitter thereof is connected to ground. The transistor Q6 has a base connected to the collector of transistor Q5 via the resistor R18 and to ground via the resistor R20. The base of transistor Q6 is connected to ground via the resistors R21 and R19, and anodes of the diodes D2 and LED2 in turn. Further, the base of transistor Q6 is connected to ground via a switch SW2. A collector of transistor Q6 is connected to a base of the transistor Q7 via the resistor R23 and an emitter thereof is connected to ground. The transistor Q7 has the base connected to the voltage terminal Vcc via the resistor R22, a collector connected to the junction of the resistors R19 and R21, and an emitter connected to Vcc.

The third control circuit 300 comprises field effect transistors (FETs) V1 and V2. A gate of the FET V1 is connected to the collector of the transistor Q3 of the first driving circuit 120 of the first control circuit 100, and a drain and a source thereof are connected to a cathode of the diode LED3 and ground respectively. A gate of the FET V2 is connected to the collector of the transistor Q7 of the second driving circuit 220, and a drain and a source thereof are connected to an anode of the diode LED3 and ground respectively. The anode and cathode of the diode LED3 are further connected to Vcc via resistors R12 and R13 respectively.

The resistance of resistors R1 and R2 of the first detecting circuit 110 is determined in accordance with the following condition that if the interface voltage Vcc is 4.75V, the voltage level at the reference terminal of the shunt regular U1 obtained from the interface voltage Vcc divided by the voltage divider formed by resistors R1 and R2, equals a reference voltage of the shunt regulator U1, 2.5V. Similarly, the resistance of resistors R14 and R15 of the second detecting circuit 210 is determined in accordance with the following condition that if the interface voltage Vcc is 5.25V, the voltage level at the reference terminal of the shunt regular U2 obtained from the interface voltage Vcc divided by the voltage divider formed by resistors R14 and R15, equals a reference voltage of the adjustable Zener shunt regulator U2, 2.5V. The operation of the voltage detecting device of the embodiment is described as follows.

If the interface voltage Vcc is less than 4.75V, the voltage level at resistor R2 obtained from the interface voltage Vcc divided by the voltage divider formed by resistors R1 and R2 is less than the reference voltage of the adjustable Zener shunt regulator U1, turning off the shunt regulator U1. Hence, the transistors Q1, Q2, Q3, Q4 are turned on, off, on, and on respectively. With the transistor Q4 turned on, a current is conducted flowing through the transistor Q4, resistor R6, diode D1, and diode LED1 accordingly. The diode LED1 is thus turned on, indicating that the interface voltage Vcc is less than 4.75V. The diode LED1 is kept on by a holding circuit formed by the resistors R5, R7, R8 and R6, and diode D1, even if the transistor Q4 is turned off. Since the transistor Q3 is turned on, the FET V1 is turned off with a low voltage level at the gate thereof.

LED1 can be short-circuited by turning on the switch SW1. Hence, no current is conducted in the circuit formed by the resistors R5, R7, R8, and R6, and diodes D1 and LED1 due to the threshold voltages of diodes D1 and LED1. The first control circuit 100 is thus reset, operating according to a current interface voltage Vcc.

Meanwhile, the voltage level at resistor R15 obtained from the interface voltage Vcc divided by the voltage divider formed by resistors R14 and R15 is less than the reference voltage of the adjustable Zener shunt regulator U2, turning off the shunt regulator U2. Hence, the transistors Q5, Q6, and Q7 are turned on, off, and off respectively. Since the transistor Q7 is turned off, no current is conducted flowing through the transistor Q7, transistor R19, diode D2, and diode LED2, turning off the diode LED D2, and the FET V2 is turned off with a low voltage level at the gate thereof. Moreover, the diode LED3 is turned off since the FET V1 is turned off.

If the voltage level of the interface voltage Vcc is greater than or equal to 5.25V, the voltage level at the resistor R2 exceeds the reference voltage of the shunt regulator U1, turning on the shunt regulator U1. Hence, the transistors Q1, Q2, Q3, Q4 are turned off, on, off, and off respectively. No current is conducted flowing through the transistor Q4, resistor R6, diode D1 and diode LED1; thus, diode LED1 is turned off. Since the transistor Q3 is turned off, the FET V1 is turned on with a high voltage level at the gate thereof.

Meanwhile, the voltage level at the resistor R15 exceeds the reference voltage of the adjustable Zener shunt regulator U2, turning on the shunt regulator U2. Hence, the transistors Q5, Q6, and Q7 are turned off, on, and on respectively. Since the transistor Q7 is turned on, a current is conducted flowing through the transistor Q7, transistor R19, diode D2, and diode LED2, turning on the diode LED D2, indicating that the interface voltage Vcc is equal to or greater than 5.25V. The diode LED2 is kept on by a holding circuit formed by the resistors R17, R18, R21 and R19, and diode D2 even if the transistor Q7 is then turned off. Further, since the transistor Q7 is turned on, the FET V2 is turned on with a high voltage level at the gate thereof. Moreover, the diode LED3 is turned off since the FET V2 is turned on.

The diode LED2 can be short-circuited by turning on the switch SW2 Hence, no current is conducted in the circuit formed by the resistors R17, R18, R21 and R19, diodes D2 and LED1 due to the threshold voltages of diodes D1 and LED1. The second control circuit 200 is thus reset, operating according to a current interface voltage Vcc.

Further, if the voltage level of interface voltage Vcc is less than 5.25V and greater or equal to 4.75V, the voltage level at resistor R2 equals or exceeds the reference voltage of the shunt regulator U1. Thus, the diode LED1 is turned off and the FET V1 in the third control circuit 300 is turned on.

Meanwhile, the voltage at the resistor R15 is less than the reference voltage of the shunt regulator U2. Thus, the diode LED2 is turned off and the FET V2 in the third control circuit is turned off.

Since the FETs V1 and V2 of the third control circuit 300 are turned on and off respectively, the diode LED3 is turned on, indicating that the interface voltage Vcc is within operating voltage range and users may use USB devices.

With the voltage level indicators displaying the USB interface voltage level, users may utilize USB peripheral devices accordingly, providing convenience. Furthermore, the embodiments are not limited to detect USB interface voltage, but an interface voltage within a certain operating range.

It is believed that the present embodiments and their advantages will be understood from the foregoing description, and it will be apparent that various changes may be made thereto without departing from the spirit and scope of the invention or sacrificing all of its material advantages, the examples hereinbefore described merely being preferred or exemplary embodiments.

What is claimed is:

1. A device for detecting an interface voltage, comprising:
   a first control circuit receiving the interface voltage to generate a first control signal and drive a first voltage level indicator if the interface voltage level is less than a first voltage level; and
   a second control circuit receiving the interface voltage to generate a second control signal and drive a second voltage level indicator if the interface voltage level exceeds a second voltage level;
   wherein the first control circuit comprises a first detecting circuit and a first driving circuit, wherein the first detecting circuit detects the interface voltage to generate a first detect signal, allowing the first driving circuit to turn on the first voltage level indicator if the interface voltage level is less than the first voltage level;

wherein the first detecting circuit comprises:
a first resistor receiving the interface voltage;
a second resistor coupled between the first resistor and ground; and
a first detecting element coupled to a junction of the first and second resistors, generating the first detect signal in response to a voltage at the junction of the first and second resistors;
wherein resistances of the first and second resistors are determined according to the interface voltage and a reference voltage of the first detect element; and
wherein the first detecting element comprises a first Zener shunt regulator having a reference terminal coupled to the junction of the first and second resistors, an anode coupled to ground, and a cathode generating the first detect signal transmitted to the first driving circuit.

2. The device as claimed in claim 1, wherein the interface voltage is a Universal Serial Bus (USB) interface voltage, 3. The device as claimed in claim 1, wherein if the interface voltage level equals the first voltage level, the voltage level at the reference terminal of the first Zener shunt regulator equals the reference voltage thereof.

4. The device as claimed in claim 1, wherein the first driving circuit comprises:
a first transistor comprising a base receiving the first detect signal and the interface voltage via a third resistor, an emitter coupled to ground, and a collector receiving the interface voltage;
a second transistor comprising a base coupled to the collector of the first transistor, an emitter coupled to ground; and a collector receiving the interface voltage via a fourth resistor;
a third transistor comprising a base coupled to the collector of the second transistor via a fifth resistor, an emitter coupled to ground, and a collector generating the first control signal;
a fourth transistor comprising an emitter receiving the interface voltage, a collector coupled to the base of the third transistor via a sixth resistor, and a base receiving the interface voltage via a seventh resistor and coupled to the collector of the third transistor; and
a first diode comprising an anode coupled to the collector of the fourth transistor via an eighth resistor, and a cathode coupled to an anode of the first voltage level indicator;
wherein the first voltage level indicator has a cathode coupled to ground.

5. The device as claimed in claim 4, wherein the first driving circuit further comprises a first reset switch coupled between the base of the third transistor and ground.

6. The device as claimed in claim 1, wherein the second control circuit comprises a second detecting circuit and a second driving circuit, wherein the second detecting circuit detects the interface voltage to generate a second detect signal, allowing the second driving circuit to turn on the second voltage level indicator if the interface voltage level exceeds the second voltage level.

7. The device as claimed in claim 6, wherein the second detecting circuit comprises:
a ninth resistor receiving the interface voltage;
a tenth resistor coupled between the ninth resistor and ground; and
a second detecting element coupled to a junction of the ninth and tenth resistors, generating the second detect signal in response to a voltage at the junction of the ninth and tenth resistors;
wherein the resistances of the ninth and tent resistors are determined according to the interface voltage and a reference voltage of the second detecting element.

8. The device as claimed in claim 7, wherein the second detecting element comprises a second Zener shunt regulator having a reference terminal coupled to the junction of the ninth and tenth resistors, an anode coupled to ground, and a cathode generating the second detect signal to the second driving circuit.

9. The device as claimed in claim 8, wherein when the interface voltage level equals the second voltage level, the voltage level at the reference terminal of the second Zener shunt regulator equals the reference voltage thereof.

10. The device as claimed in claim 6, wherein the second driving circuit comprises:
a fifth transistor comprising a base receiving the second detect signal and the interface voltage via a eleventh resistor, an emitter coupled to ground, and a collector receiving the interface voltage via a twelfth resistor;
a sixth transistor comprising a base coupled the collector of the fifth transistor via a thirteenth resistor, an emitter coupled to ground and a collector;
a seventh transistor comprising an emitter receiving the interface voltage, a base coupled to receiving the interface voltage via a fourteenth resistor and coupled to the collector of the sixth transistor, and a collector generating the second control signal and coupled to the base of the sixth transistor via a fifteenth resistor; and
a second diode comprising an anode coupled to the collector of the seventh transistor via a sixteenth resistor, and a cathode coupled to an anode of the second voltage level indicator;
wherein the second voltage level indicator has a cathode coupled to ground.

11. The device as claimed in claim 10, wherein the second driving circuit further comprises a second reset switch coupled between the base of the sixth transistor and ground.

12. The device as claimed in claim 1, further comprising a third control circuit coupled to the first and second control circuits, receiving the first and second control signals to drive a third voltage level indicator if the interface voltage level is between the first and second voltage levels.

13. The device as claimed in claim 12, wherein the third control circuit comprises:
a first FET comprising a gate receiving the first control signal, a source coupled to ground, and a drain coupled to a cathode of the third voltage level indicator; and
a second FET comprising a gate receiving the second control signal, a source coupled to ground, and a drain coupled to an anode of the third voltage level indicator.

14. The device as claimed in claim 13, wherein the third control circuit further comprises:
a seventeenth resistor comprising a first terminal receiving the interface voltage and a second terminal coupled to the anode of the third voltage level indicator; and
an eighteenth resistor comprising a first terminal receiving the interface voltage and a second terminal coupled to the cathode of the third voltage level indicator.

15. A device for detecting an interface voltage, comprising:
a first control circuit receiving the interface voltage to generate a first control signal and drive a first voltage level indicator, comprising a first detecting circuit detecting the interface voltage to generate a first detect signal and a first driving circuit turning on the first voltage level indicator in response to the first detect signal if the interface voltage level is less than a first voltage level;

a second control circuit receiving the interface voltage to generate a second control signal and drive a second voltage level indicator, comprising a second detecting circuit detecting the interface voltage to generate a second detect signal and a second driving circuit turning on the second voltage level indicator if the interface voltage level exceeds a second voltage level; and a third control circuit coupled to the first and second control circuits, receiving the first and second control signals to drive a third voltage level indicator if the interface voltage level is between the first and second voltage levels; wherein the third control circuit comprises:

a first FET comprising a gate receiving the first control signal, a source coupled to ground, and a drain coupled to a cathode of the third voltage level indicator; and a second FET comprising a gate receiving the second control signal, a source coupled to ground, and a drain coupled to an anode of the third voltage level indicator;

wherein the anode of the third voltage level indicator receives the interface voltage via a seventeenth resistor and a cathode thereof receives the interface voltage via an eighteenth resistor.

16. The device as claimed in claim 15, wherein the first detecting circuit comprises:

a first resistor receiving the interface voltage;

a second resistor coupled between the first resistor and ground; and a first detecting element coupled to a junction of the first and second resistors, generating the first detect signal in response to a voltage at the junction of the first and second resistors;

wherein resistances of the first and second resistors are determined according to the interface voltage and a reference voltage of the first detect element.

17. The device as claimed in claim 16, wherein the first detecting element comprises a first Zener shunt regulator having a reference terminal coupled to the junction of the first and second resistors, an anode coupled to ground, and a cathode generating the first detect signal transmitted to the first driving circuit, wherein the interface voltage level equals the first voltage level if the voltage level at the reference terminal of the first Zener shunt regulator equals the reference voltage thereof.

18. The device as claimed in claim 15, wherein the first driving circuit comprises:

a first transistor comprising a base receiving the first detect signal and the interface voltage via a third resistor, an emitter coupled to ground, and a collector receiving the interface voltage;

a second transistor comprising a base coupled to the collector of the first transistor, an emitter coupled to ground; and a collector receiving the interface voltage via a fourth resistor;

a third transistor comprising a base coupled to the collector of the second transistor via a fifth resistor, an emitter coupled to ground, and a collector generating the first control signal;

a fourth transistor comprising an emitter receiving the interface voltage, a collector coupled to the base of the third transistor via a sixth resistor, and a base receiving the interface voltage via a seventh resistor and coupled to the collector of the third transistor; and a first diode comprising an anode coupled to the collector of the fourth transistor via an eighth resistor, and a cathode coupled to an anode of the first voltage level indicator;

wherein the first voltage level indicator has a cathode coupled to ground.

19. The device as claimed in claim 18, wherein the first driving circuit further comprises a first reset switch coupled between the base of the third transistor and ground.

20. The device as claimed in claim 15, wherein the second detecting circuit comprises:

a ninth resistor receiving the interface voltage;

a tenth resistor coupled between the ninth resistor and ground; and a second detecting element coupled to a junction of the ninth and tenth resistors, generating the second detect signal in response to a voltage at the junction of the ninth and tenth resistors;

wherein the resistances of the fourteenth and fifteenth resistors are determined according to the interface voltage and a reference voltage of the second detecting element.

21. The device as claimed in claim 20, wherein the second detecting element comprises a second Zener shunt regulator having a reference terminal coupled to the junction of the ninth and tenth resistors, an anode coupled to ground, and a cathode generating the second detect signal to the second driving circuit, wherein if the interface voltage level equals the second voltage level, the voltage level at the reference terminal of the second Zener shunt regulator equals the reference voltage thereof.

22. The device as claimed in claim 15, wherein the second driving circuit comprises:

a fifth transistor comprising a base receiving the second detect signal and the interface voltage via a eleventh resistor, an emitter coupled to ground, and a collector receiving the interface voltage via a twelfth resistor;

a sixth transistor comprising a base coupled the collector of the fifth transistor via a thirteenth resistor, an emitter coupled to ground and a collector;

a seventh transistor comprising an emitter receiving the interface voltage, a base coupled to receiving the interface voltage via a fourteenth resistor and coupled to the collector of the sixth transistor, and a collector generating the second control signal and coupled to the base of the sixth transistor via a fifteenth resistor; and a second diode comprising an anode coupled to the collector of the seventh transistor via a sixteenth resistor, and a cathode coupled to an anode of the second voltage level indicator;

wherein the second voltage level indicator has a cathode coupled to ground.

23. The device as claimed in claim 22, wherein the second driving circuit further comprises a second reset switch coupled between the base of the sixth transistor and ground.

24. A detection device assembly comprising:

an interface configured for receiving a signal from a peripheral electronic device of which an operating voltage range is between a first voltage level and a second voltage level;

a detection device configured for detecting an interface voltage of the interface, the detection device comprising:

a first control circuit comprising a first detecting circuit for receiving the interface voltage to generate a first detect signal, and a first driving circuit comprising a first voltage level indicator and receiving the first detect signal to generate a first control signal to control the first voltage level indicator; and a second control circuit comprising a second detecting circuit for receiving the interface voltage to generate a second detect signal, and a second driving circuit comprising a second voltage level indicator and receiving the second detect signal to generate a second control signal to control the second voltage level indicator, wherein when the interface voltage level is lower than the first voltage level, the first voltage level indicator turns on and when the interface voltage level is higher than the second voltage level, the second voltage level indicator turns on;

wherein the second driving circuit comprises:

a first transistor comprising a base receiving the second detect signal and the interface voltage via a first resistor, an emitter coupled to ground, and a collector receiving the interface voltage via a second resistor;

a second transistor comprising a base coupled to the collector of the first transistor via a third resistor, an emitter coupled to ground, and a collector;

a third transistor comprising an emitter receiving the interface voltage, a base coupled to the emitter of the third transistor via a fourth resistor and coupled to the collector of the second transistor, and a collector generating the second control signal and coupled to the base of the second transistor via a fifth resistor; and a diode comprising an anode coupled to the collector of the seventh transistor via a sixth resistor, and a cathode coupled to an anode of the second voltage level indicator;

wherein the second voltage level indicator has a cathode coupled to ground,

25. The assembly as claimed in claim 24, wherein the detection device further comprises a third control circuit coupled between the first and second control circuit for receiving the first and second control signals, the third control circuit comprising a third voltage level indicator which turns on when the interface voltage level is between the first and second voltage level.

26. The assembly as claimed in claim 24, wherein the interface is a Universal Serial Bus interface, and the first voltage level is 4.75 volt and the second voltage level is 5.25 volt.

* * * * *